US005115472A

United States Patent [19]

Park et al.

[11] Patent Number: 5,115,472

[45] Date of Patent: May 19, 1992

[54] ELECTROACOUSTIC NOVELTIES

[76] Inventors: Kyung T. Park, 710 Newton Rd., Berwyn, Pa. 19312; Peter F. Radice, 438 Springhouse Rd., King of Prussia, Pa. 19406

[21] Appl. No.: 255,008

[22] Filed: Oct. 7, 1988

[51] Int. Cl.[5] .................... H04R 25/00; G09F 27/00; H01L 41/04

[52] U.S. Cl. .................... 381/152; 40/455; 310/324; 310/800; 381/150; 381/188; 381/192

[58] Field of Search .............. 381/152, 190, 188, 205, 381/150, 191; 310/800, 324; 116/173; 40/124.1, 455

[56] References Cited

U.S. PATENT DOCUMENTS

| | | | |
|---|---|---|---|
| 3,422,224 | 1/1969 | Curran | 381/75 |
| 3,629,522 | 12/1971 | Richards | 381/74 |
| 3,792,204 | 2/1974 | Murayama et al. | 310/800 |
| 3,816,774 | 6/1974 | Ohnuki et al. | 310/800 |
| 3,947,644 | 3/1976 | Uchikawa | 381/190 |
| 4,024,355 | 5/1977 | Takahashi | 381/190 |
| 4,048,454 | 9/1977 | Barcus et al. | 381/190 |
| 4,088,915 | 5/1978 | Kodama | 310/800 |
| 4,322,585 | 3/1982 | Liautaud | 381/151 |
| 4,322,877 | 4/1982 | Taylor | 310/800 |
| 4,352,961 | 10/1982 | Kumada et al. | 310/324 |
| 4,597,099 | 6/1986 | Sawafuji | 381/190 |
| 4,638,207 | 1/1987 | Radice | 310/800 |
| 4,748,366 | 5/1988 | Taylor | 310/800 |
| 4,807,294 | 2/1989 | Iwata et al. | 381/188 |
| 4,820,952 | 4/1989 | Lee | 381/190 |

FOREIGN PATENT DOCUMENTS

| | | | |
|---|---|---|---|
| 1926517 | 2/1970 | Fed. Rep. of Germany | 40/455 |
| 2613863 | 10/1988 | France | 40/455 |
| 2210232 | 6/1989 | United Kingdom | 381/150 |

OTHER PUBLICATIONS

B. Locanthi et al., "Development of a Loudspeaker System with Omini-Directional Horn Loaded High Polymer Tweeter," Pioneer Electronics Corporation, presented at the 58th Convention of the Audio Engineering Society, 1977, pp. 1-19.

M. Tamura et al., "Electroacoustic Transducers with Piezoelectric High Polymer Films," *Journal of the Audio Engineering Society,* vol. 23, No. 1, Jan./Feb. 1975, pp. 21-26.

S. Edelman et al., "Comments on Electroacoustic Transducers with Piezoelectric High Polymer Films," *Journal of the Audio Engineering Society,* vol. 24, No. 7, Sep. 1976, pp. 557-558.

F. Micheron et al., "Dome-Shaped Piezopolymer Electroacoustic Transducers," *Ferroelectrics,* vol. 51, 1983, pp. 143-150.

J. Klapholz, "High Polymer Piezo Film in Electroacoustical Transducer Applications," presented at the 79th Audio Engineering Society, Oct. 12-16, 1985, pp. 1-11.

J. Klapholz, "Polymer Film For Transducers," *dB Magazine,* Nov.-Dec. 1985, pp. 27-32.

WO8403576 "Display Panels and Video Signs", Salomon Borensztejn, Sep. 1984.

*Primary Examiner*—James L. Dwyer
*Assistant Examiner*—William D. Cummng

[57] ABSTRACT

Electroacoustic novelties are disclosed having a piezoelectric polymer film which functions as a speaker or microphone. The novelties include flags, banners, posters or articles of headwear. The piezoelectric polymer film may be attached to a portion of the flexible substrate forming the novelty, or it may be used as an integral part of the novelty structure. An audio output or recording device is electrically coupled to the piezoelectric polymer film. Both the piezoelectric polymer film and the electrodes may be transparent so that the adjoining portion of the novelty is visible.

26 Claims, 6 Drawing Sheets

FIG. 5
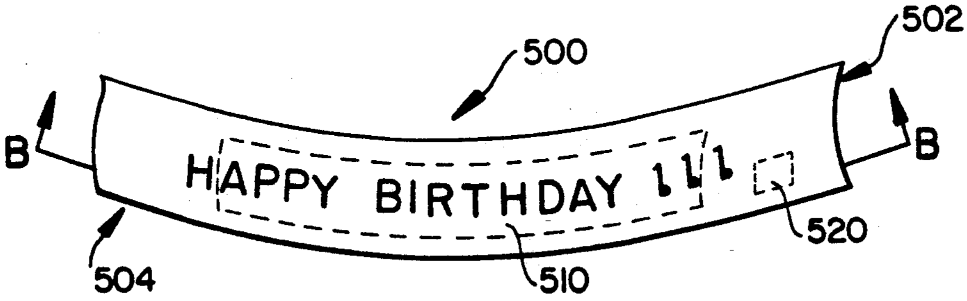
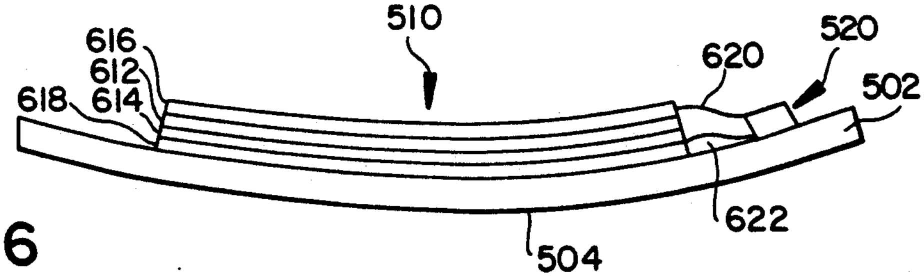
FIG. 6
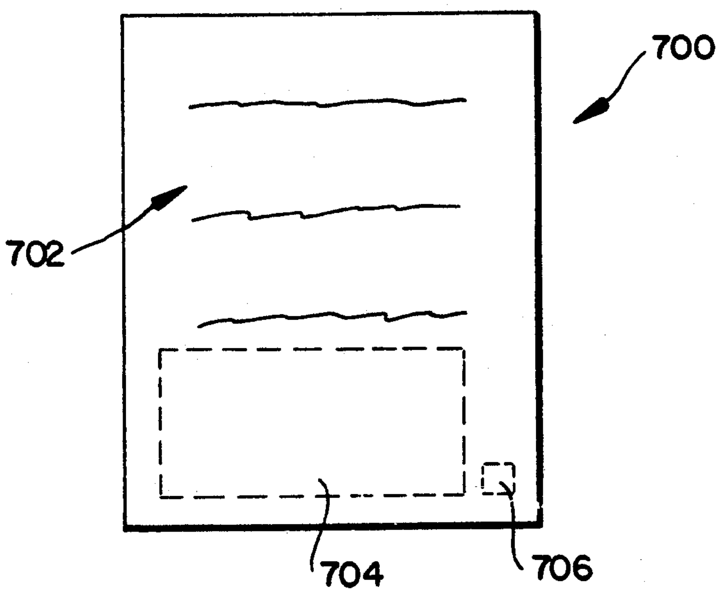
FIG. 7

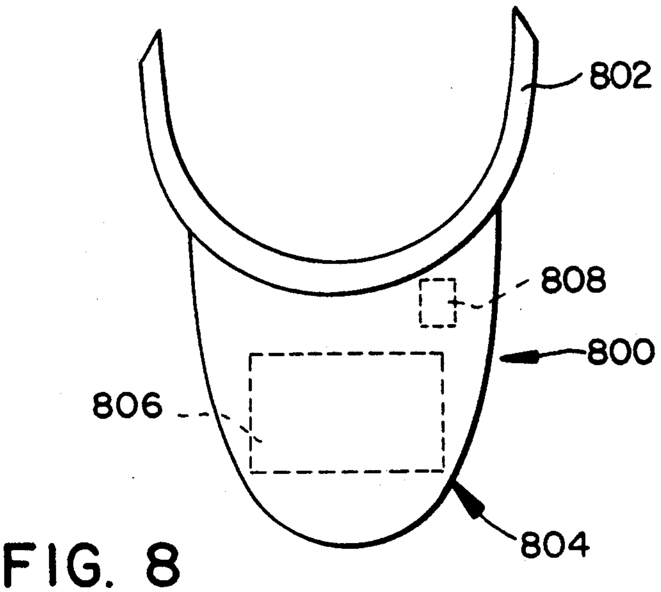
FIG. 8
FIG. 9
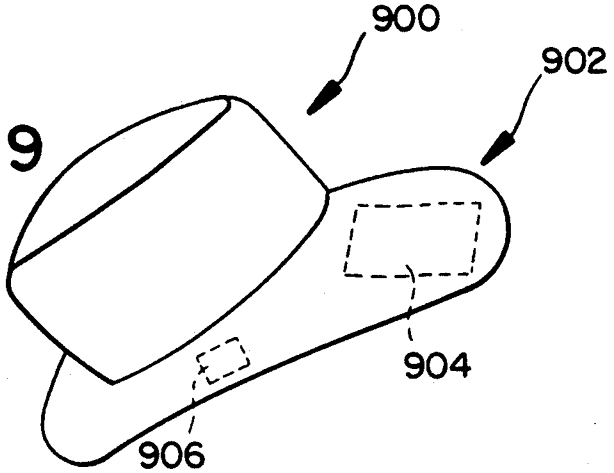
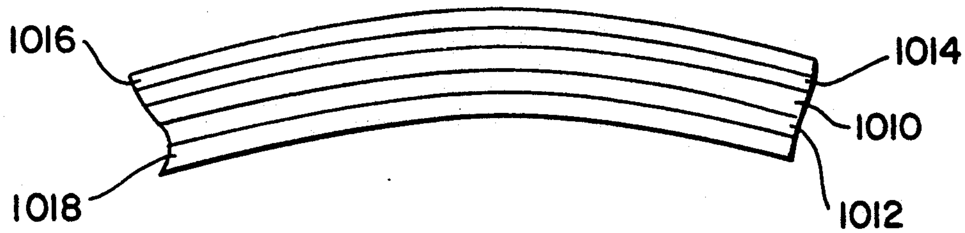
FIG. 10

ELECTROACOUSTIC NOVELTIES

BACKGROUND OF THE INVENTION

The present invention relates to electroacoustic novelties and, more particularly, to such novelties containing piezoelectric polymer film.

Traditional piezoelectric materials include certain naturally occurring crystals, such as quartz and Rochelle salts, as well as synthesized ceramics, such as barium titanate. These materials are capable of functioning as a speaker by converting electrical energy into sound or as a microphone by converting acoustic wave pressure into a corresponding electrical signal. In these electroacoustic applications, the piezoelectric material is typically mounted within a housing so that it can freely vibrate.

The above mentioned piezoelectric materials have been incorporated into a variety of articles to produce sound. For example, U.S. Pat. No. 4,597,099 issued Jun. 24, 1986 discloses the use of a piezoelectric crystal sound producer in a greeting card. A piezoelectric crystal, mounted in an appropriate housing, is electrically connected to an audio memory circuit. When the card is opened, a switching mechanism is activated and a musical tune is emitted from the vibrating piezoelectric material. This patent also discloses that the crystal sound producer may be incorporated into badges, emblems, pendants, lighters and keyholders.

Posters or display boards containing audio devices are known in the art. A conventional cone-type loudspeaker is mounted on the poster to deliver a voice or music message which coincides with the visual display image. The audio message is stored in a playback device, such as an audio memory circuit or a tape recorder. A mechanical switch mounted on the poster is used to activate the playback device to generate the audio message.

Piezoelectric polymer films, such as polyvinylidene fluoride, have also been used as transducer elements in both microphones and speakers. These materials are generally more flexible, lighter in weight and have a broader frequency response than the traditional piezoelectric materials. An example of the use of such films in a speaker application may be found in commonly assigned U.S. Pat. No 4,638,207 issued Jan. 20, 1987. A piezoelectric polymer film is conformably adhered to either the inner or outer surfaces of an inflated member, such as a balloon. When the appropriate audio signal is supplied to the electrodes on the piezoelectric film and the balloon is filled with helium, the device functions as a floating speaker.

SUMMARY OF THE INVENTION

The electroacoustic novelty of the present invention has a flexible portion or element with a curved, non-volume enclosing, noncontinuous cross section. A piezoelectric polymer film with electrodes electrically coupled to its opposed surfaces is attached to the novelty such that it conformably adheres to the portion or element having the curved, non-volume enclosing, noncontinuous cross section. An audio frequency signal voltage is applied across the piezoelectric film to cause the film to vibrate and emit sound waves. Alternatively, the electrodes can be electrically coupled with a receiving device for processing the electrical signal generated by the piezoelectric film when it is caused to vibrate by received sound waves.

As a further embodiment of the present invention, the electroacoustic novelty, or a portion thereof, is fabricated from a piezoelectric polymer film having a curved, non-volume enclosing cross section. The appropriate electrodes and electrical conductors are electrically coupled with the film in the manner described for the first embodiment.

As still further embodiments of the present invention, the electroacoustic novelty containing the piezoelectric film is in the form of a flag, a banner or poster having an outwardly facing display surface, or an article of headware.

BRIEF DESCRIPTION OF THE DRAWINGS

FIG. 5 is a front view of the electroacoustic banner of the present invention.

FIG. 6 is a section view taken along line B—B in FIG. 5.

FIG. 7 is a front view of the electroacoustic poster of the present invention.

FIG. 8 is a view of the electroacoustic visor of the present invention.

FIG. 9 is a view of the electroacoustic hat of the present invention incorporating a piezoelectric polymer film within the brim.

FIG. 10 is a cross section of a portion of the visor and hat shown in FIGS. 8 and 9, respectively, where the brim of such articles is fabricated from a piezoelectric polymer film.

DETAILED DESCRIPTION OF THE PREFERRED EMBODIMENTS

Figure 1:
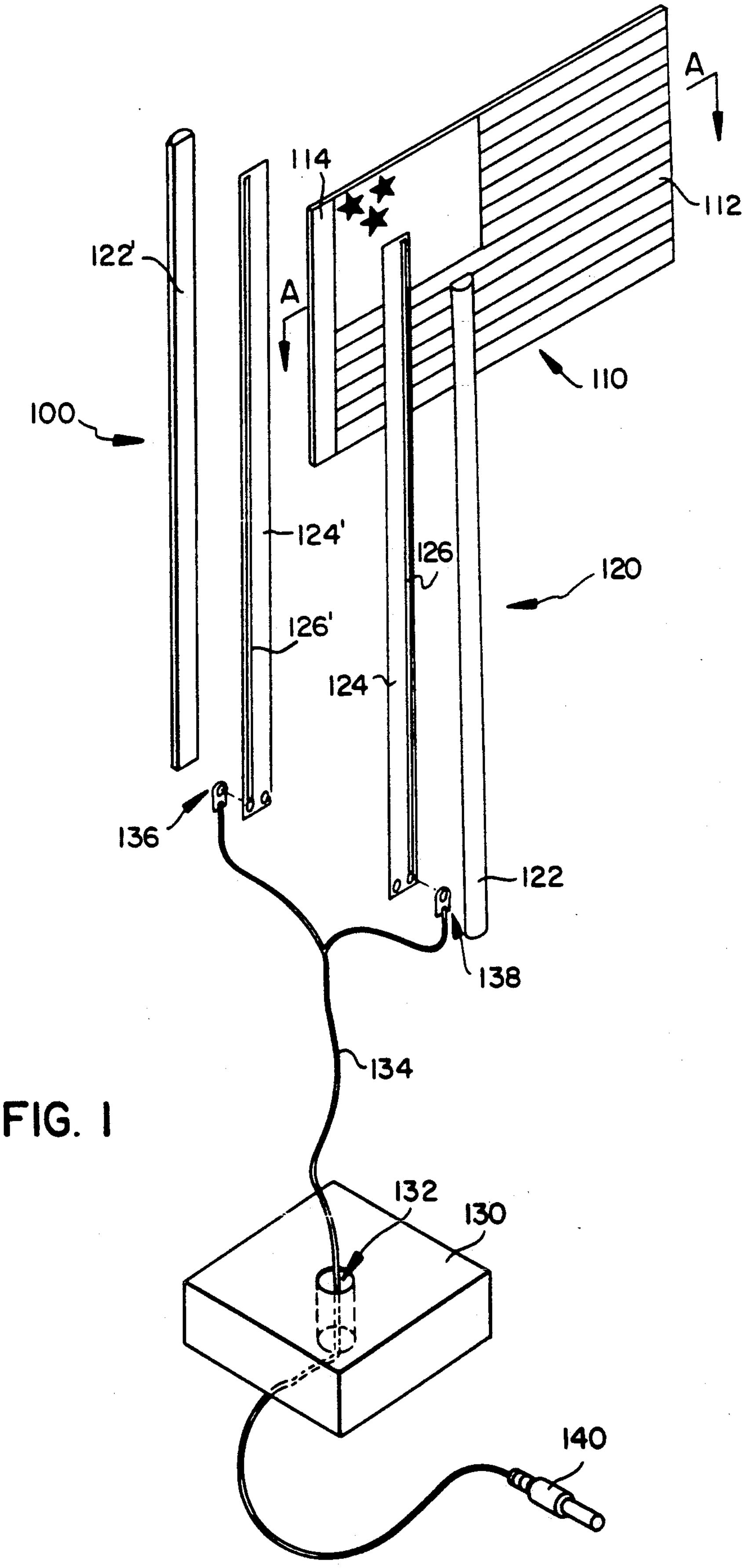
FIG. 1 is a view of the partially assemble electroacoustic flag of the present invention with the associated staff and base.

The novelties of the present invention include non-inflatable articles having a curved, non-volume enclosing, noncontinuous cross section. It is not necessary for the entire article to have such a configuration so long as at least a portion of the article, or an element thereof, having such a cross section has sufficient area for the placement of the piezoelectric polymer film. In some applications, the piezoelectric polymer film may be used to fabricate this portion of the novelty. Otherwise, the portion of the novelty having such a configuration is constructed from a flexible material, such as plastic film, thin sheet metal, paper, foam board, cardboard, fabrics and the like, which will allow the piezoelectric polymer film to vibrate when conformably adhered thereto. The sound output is generally 6–20 dB greater when the piezoelectric polymer film is mounted on MYLAR® polyethylene terephthalate resin sheet available from DuPont, or thin sheet metal as opposed to cardboard or paper. Examples of such novelties include a draped flag, a brim of a hat or visor, a poster or banner mounted such that the display surface bows slightly, a substantially flat poster or banner with a curved film mounted behind the display surface, a picture frame having a curved cross section and the like. The curved, non-volume enclosing cross section is preferred over a planar cross section because of the increased acoustic properties, such as the quality of emitted sound, which are achieved.

According to the present invention, the novelty includes material which possesses piezoelectric activity. Flexible piezoelectric polymer films with electrodes on opposed sides are preferred. Polyvinylidene fluoride (PVDF) film is an example of a polymer which possesses such activity. Polyvinylidene fluoride is approximately 50 percent crystalline and 50 percent amorphous. The principal crystalline forms of PVDF are the highly polar beta form and a nonpolar alpha form. Useful piezoelectric properties are associated with the polar beta form. In order to increase the piezoelectric properties of polyvinylidene fluoride, the film is mechanically oriented and subjected to an intense electrical field, otherwise known as poling, to cause the oriented, polarized beta form crystallites to predominate. Piezoelectric polymer films which had been treated in this manner are commercially available from the Atochem North America, Inc. Philadelphia, Pa. Other suitable piezoelectric films useful in the present invention include those formed from high molecular weight polymers, such as polyvinyl fluoride, polyvinyl chloride, and polyamides. Furthermore, copolymers as well as polymer mixtures or blends may be used. Suitable copolymers include those which are based on vinylidene fluoride, preferably those copolymers or terpolymers as containing at least 65 mole percent of vinylidene fluoride and at least one other copolymerizable halogenated monomer, such as trifluoroethylene, tetrafluoroethylene or vinyl fluoride.

Referring now to the drawings, where like reference numerals indicate like elements, FIG. 1 illustrates an electroacoustic flag novelty which is generally designated 100. This novelty includes the electroacoustic flag 110 which contains a decorative, flexible dielectric polymer film 112 containing the flag's design.

Figure 2:
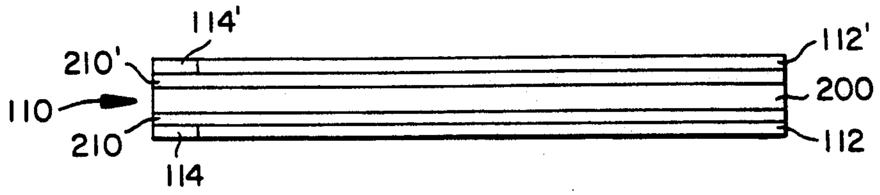
FIG. 2 is a section view taken along line A—A in FIG. 1.

As shown in FIG. 2, the flag 110 contains a flag-shaped piezoelectric polymer film 200. This film has a thickness in the range of about 28 to about 110 microns. Immediately adjacent to the piezoelectric polymer film 200 are first and second electrodes 210 and 210', respectively, fabricated from an electroconductive material. These electrodes 210 and 210' are formed on the piezoelectric polymer film 200 so that they are electrically coupled with the opposed major surfaces of the film. The electrodes are typically deposited on the piezoelectric polymer film using conventional screen printing processes which employ a conductive ink, such as silver, nickel, copper or other conductive particles, suspended in a suitable polymer matrix. The electrodes may also be deposited on the piezoelectric polymer film using conventional thin film vacuum deposition techniques. The decorative dielectric polymer layers 112 and 112' are disposed on the electrodes 210 and 210', respectively. The decorative layers 112 and 112' can be a screen printed dielectric polymer ink, such as urethane or acrylic coatings, containing the appropriate colors to form the flag design. Alternatively, the decorative layers 112 and 112' can be preprinted dielectric polymer layers which are laminated to the electrodes 210 and 210' with a suitable adhesive, such as pressure sensitive acrylics (not shown). A portion of the electrodes 210 and 210' is covered with a conductive adhesive 114 and 114', such as a conductive epoxy or a silver based conductive adhesive (PWS 60) available from Atochem North America, Inc., so that electrical connections can be made with the electrodes 210 and 210'.

Returning now to FIG. 1, the flagstaff is generally designated as 120. The staff 120 contains a rod which is cut into two halves 122 and 122'. These halves 122 and 122' may be fabricated from plastic or wood. A pair of dielectric polymer films 124 and 124', such as polyethylene terephthalate resin film having a thickness of about 3 mils, with associated conductive leads 126 and 126' are disposed between the two halves 122 and 122' of the staff. The conductive lead portions 126 and 126' face and contact the conductive adhesive portions 114 and 114' (FIG. 2) of piezoelectric flag 110. The conductive lead portions 126 and 126' are formed on the dielectric polymer films 124 and 124' using the techniques described earlier for depositing the electrodes 210 and 210'. As shown in the figure, the dielectric polymer films 124 and 124' are concealed within the two halves 122 and 122' of the staff 120. The entire staff assembly 120 is adhesively or mechanically secured together to form a laminated structure which supports the flag 110. Although not shown in FIG. 1, when the flag 110 is attached to the staff 120 it curls such that at least a portion of the flag's cross section has a curved, non-volume enclosing configuration.

A base 130, such as wood or plastic, containing an appropriately dimensioned aperture 132 is provided for receiving and supporting the staff 120. A cable 134 containing two electrical conductors with terminals 136 and 138 is electrically coupled with the leads 126 and 126' on dielectric polymer films 124 and 124'. The other end of the wire 134 contains a connector 140, such as a conventional phono plug.

When the electroacoustic flag shown in FIG. 1 is connected to an audio device which applies an audio-frequency signal voltage across the piezoelectric film, the flag functions as a speaker since the film vibrates and emits sound waves. As used herein, audio-frequency signal includes sonic as well as subsonic and ultrasonic frequencies. Generally, the connector 140 would be electrically coupled through conventional amplification and impedance matching circuitry to a radio, tape player, phonograph or other audio-frequency transducer device producing an output.

As an alternative embodiment, the connector 140 may be connected to a receiving device (not shown) which processes the electrical signal which is generated by the piezoelectric polymer film when the pressure of the received sound waves causes the piezoelectric film to vibrate. The receiving device may be an amplifier with a speaker so that amplified sound is produced, or may be a tape recorder or other recording device which transfers the generated electrical signal to a recordable medium, such as magnetic tape for storage and later playback purposes. When operating as a microphone or audio-frequency transducer device producing an input, it is also advantageous for at least a portion of the piezoelectric polymer film to be draped such that it has a curved, non-volume enclosing, noncontinuous cross section.

Figure 3:
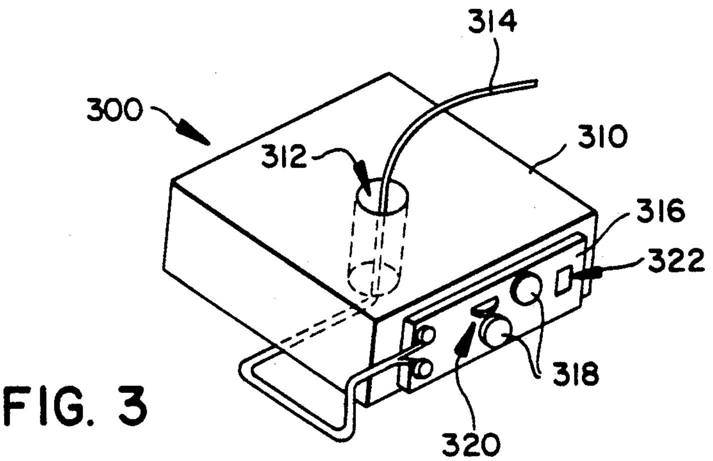
FIG. 3 is a view of an alternative base for the flag shown in FIG. 1 incorporating a device for supplying an audio-frequency signal voltage to the piezoelectric flag.

Turning now to FIG. 3, an alternative base is generally designated as 300. The base 310 contains an aperture 312 for receiving the staff assembly 120. A cable 314 extends from a tune or voice generator 316 to the leads disposed within the staff (not shown). The tune or voice generator 316 contains batteries 318, a tune-voice chip 320 and a switch 322 for activating the sound. When the switch 322 is activated, the tune-voice chip generates the appropriate electrical signal which is supplied via the conductor 314 to the piezoelectric polymer flag.

Figure 4:
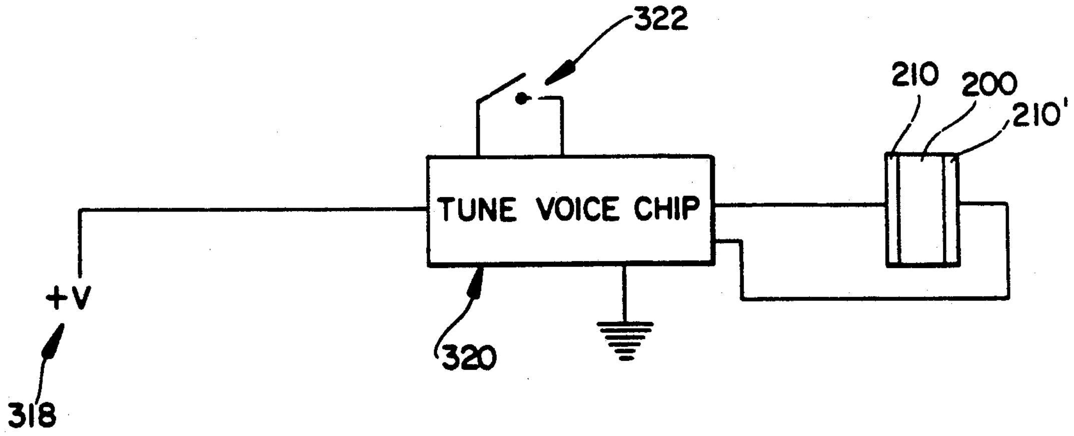
FIG. 4 is a schematic of the device shown in FIG. 3 for supplying an audio-frequency signal voltage to the piezoelectric film.

Referring now to FIG. 4, an electrical schematic of tune or voice generator 316 shown in FIG. 3 is illustrated. A tune-voice chip 320, such as model no. UM-3166-8H available from UMC Corporation or other programmable speech chips, such as those available from Texas Instruments, is electrically coupled with the electrodes 210 and 210′ of the piezoelectric polymer film 200 and the voltage supply 318. A switch 322 is connected to the chip 320 to control the activation of the sound. Conventional mechanical type switches as well as sound or infrared light activated switches may be employed. When the switch 322 is closed, an audio-frequency signal voltage, preprogrammed in the memory of the chip 320, is supplied to the piezoelectric film 200 to cause it to vibrate and emit sound waves.

Although FIGS. 1 and 2 show that the entire flag is constructed from the piezoelectric polymer film, other non-piezoelectric, flexible materials, such as polyethylene terephthalate resin film, may be used as the substrate for the flag. The piezoelectric polymer film is then attached to the substrate with an acrylic pressure sensitive adhesive.

As a further embodiment of the present invention, as shown in FIG. 5, the electroacoustic novelty may include a banner which is generally designated as 500. The banner 500 contains a flexible substrate portion 502, such as plastic films, paper, felt, fabric, or foam board, which is affixed to a wall or other support surface such that it has a curved, non-volume enclosing, noncontinuous cross section. As discussed earlier, this configuration enhances the quality of the sound which is produced when a device functions as a speaker. The substrate 502 contains an outwardly facing display surface 504 containing an appropriate message or design. On the side opposite to the display surface 504 is the electroacoustic transducer 510 containing the piezoelectric polymer film and the device 520 for supplying the appropriate audio-frequency signal to the transducer. As shown in FIG. 6, the piezoelectric polymer film 612 contains electrodes 614 and 616 disposed on its opposed major surfaces. The piezoelectric film 612 with the electrodes conformably adheres to banner substrate 502 through the use of an adhesive 618, such as pressure sensitive acrylic-type. The device 520 for producing the audio-frequency signal voltage is also attached to the back of the banner using a suitable adhesive. Electrical conductors 620 and 622 are provided for electrically coupling the device 520 with the electrodes 614 and 616 on the piezoelectric polymer film 612.

As a further alternative to the banner shown in FIGS. 5 and 6, the novelty may be in the form of a poster which is generally designated as 700. The poster has an outwardly facing display surface 702 with the piezoelectric transducer 704 and associated device 706 for producing the audio-frequency signal disposed on the rear surface thereof as described earlier for the banner. The poster would also be mounted to a wall or other support surface such that it is slightly bowed to have curved, non-volume enclosing, noncontinuous cross section. For example, a pressure sensitive adhesive is applied along the edges of the poster 700 and the poster is mounted on a wall such that it bows outwardly.

The materials used to fabricate the banner 500 of FIGS. 5 and 6 are also used to fabricate the poster 700. Laminated materials, such as paper bearing the poster design disposed between two transparent plastic films, can also be employed.

Although FIGS. 5–7 show that the substrate for the banner or poster is construcrted from a non-piezoelectric material, the technique previously described for constructing the flag and illustrated in FIG. 2 can be used to fabricate the banner or poster. A piezoelectric polymer film with electrodes is used as the substrate for the poster or banner. The display surface layer containing the poster or banner design is applied over at least one of the electrodes in the same manner as the decorative layers 112 and 112′ are applied to the flag. If the display surface layer is applied to only one of the electrodes, a dielectric film is then applied over the remaining electrode.

FIGS. 5–7 show that the piezoelectric polymer film is applied to the back surface of the poster or banner. However, it is also a feature of the present invention to apply the piezoelectric film over the front display side of the poster or banner. Transparent piezoelectric polymer films, such as polyvinylidene fluoride, with transparent indium tin oxide electrodes are used so that the display surface is not obscured. The transparent indium tin oxide electrodes are applied to the piezoelectric polymer film using vacuum deposition techniques.

As an additional embodiment of the present invention, FIG. 8 illustrates the tennis visor of the present invention which is generally designated as 800. The visor 800 contains a headband portion 802 which secures the article to the user's head. The brim portion 804 has the curved, non-volume enclosing cross section which is suitable for receiving the piezoelectric polymer film transducer 806 and associated device 808 for producing the audio-frequency signal. These components 806 and 808 are electrically connected and attached to the visor in the same manner as described earlier with regard to FIGS. 5 and 6 for the banner.

As a still further embodiment, the novelty may include a hat 900 with a brim portion 902 which is slightly bowed. The piezoelectric film 904, with the associated electrodes, and the device 906 for supplying the audio-frequency signal voltage are also electrically connected and attached in the same manner described earlier for the banner 500.

FIG. 10 illustrates a still further embodiment of the headware shown in FIGS. 8 and 9. In this embodiment the piezoelectric polymer film 1010 is bowed such that it forms the brim of the hat or visor. As with the other embodiments, electrodes 1012 and 1014 are formed on the opposed major surfaces of the piezoelectric polymer film 1010. In this embodiment if it is desirable to have the brim transparent, indium tin oxide may be used as the electrode material. Additional dielectric polymer films 1016 and 1018 may be disposed over the electrodes 1012 and 1014. These dielectric polymer films serve to protect the electrodes on the piezoelectric polymer film 1010. The piezoelectric brim is attached to the remainder of the headware by an adhesive, such as acrylic pressure sensitive type, so that it maintains the bowed cross section.

The novelties of FIGS. 5 through 10 may also be connected to the other audio devices used with the flag embodiment. Furthermore, these novelties may also function as microphones and would therefore be coupled with the previously described receiving devices.

Figure 11:
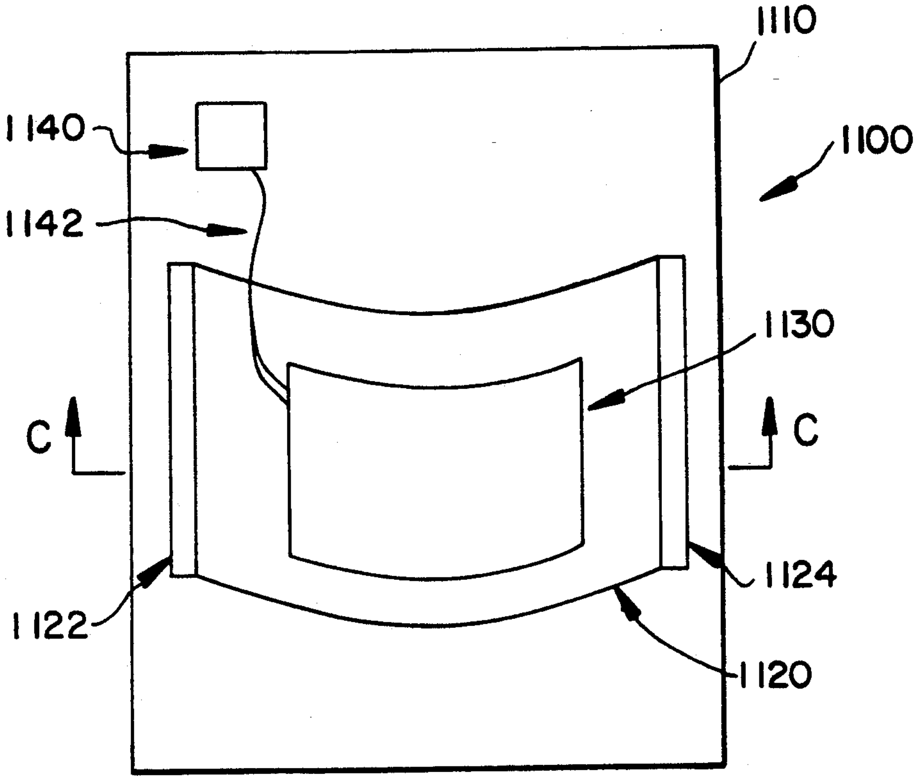
FIG. 11 is a back view of an alternative electroacoustic poster of the present invention.
Figure 12:
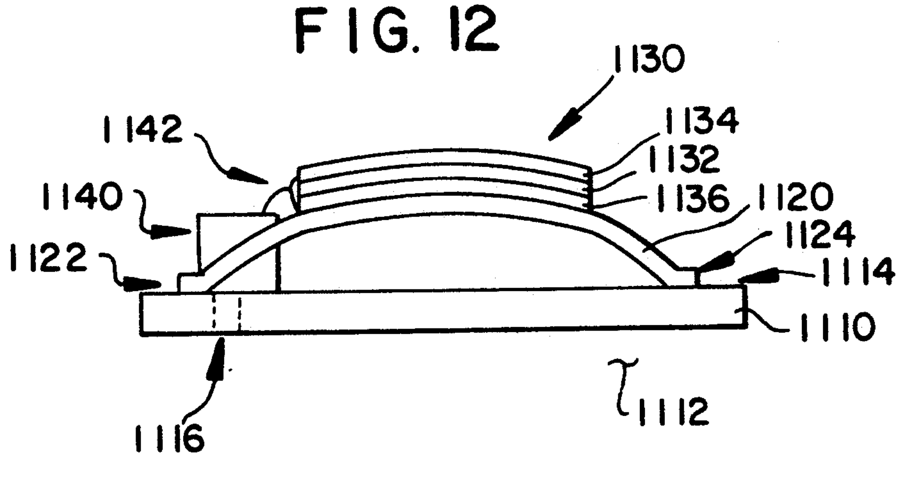
FIG. 12 is a section view taken along line C—C in FIG. 11.

Referring now to FIGS. 11 and 12, an alternative electroacoustic poster of the present invention is generally designated as 1100. This poster differs from that shown in FIG. 7 because the piezoelectric transducer 1130 is suspended on the back surface 1114 of the poster substrate 1110 so that it may freely vibrate. This arrangement allows for more rigid materials which remain relatively flat to be used as the substrate 1110, although the previously described flexible materials can also be employed. The front side 1112 of the poster substrate 1110 contains the design or indicia.

As best shown in FIG. 12, the piezoelectric transducer 1130 contains a piezoelectric polymer film 1132 with first and second electrodes 1134 and 1136, respectively, on its opposed major surfaces. The transducer 1130 is adhesively mounted on a flexible mounting member 1120 which has a curved cross section that bows outwardly away from the poster substrate 1110. The mounting member 1120 is generally a flexible film, such as polyethylene terephthalate resin sheet or other flexible polymeric film, paper, cardboard, foam board, such as VOLARA TM available foam board from Veltec, Inc., thin sheet metal and the like, which will allow the transducer 1130 to vibrate when an audio-frequency signal voltage is applied across the electrodes 1134 and 1136. The mounting member 1120 is attached to the poster 1110 with a pressure sensitive acrylic adhesive which is applied along the edges 1122 and 1124.

The electroacoustic poster 1100 also contains a device 1140 mounted on the back surface 1114 of the poster for producing an audio-frequency signal voltage. The device 1140 is electrically coupled with the electrodes 1134 and 1136 via a cable 1142 containing two conductors. The circuit shown in FIG. 4 can be used as the device 1140. Alternatively, the circuit shown in FIG. 13 can be employed. This circuit contains a proximity or motion sensor 1310 which is used as a switching mechanism that activates the device generating the audio-frequency signal. Thus, the audio message is automatically activated when a person approaches the poster. As best shown in FIG. 12, the poster substrate 1110 contains an aperture 1116 which allows for the proximity or motion sensor 1310 to view the area in front of the poster.

Figure 13:
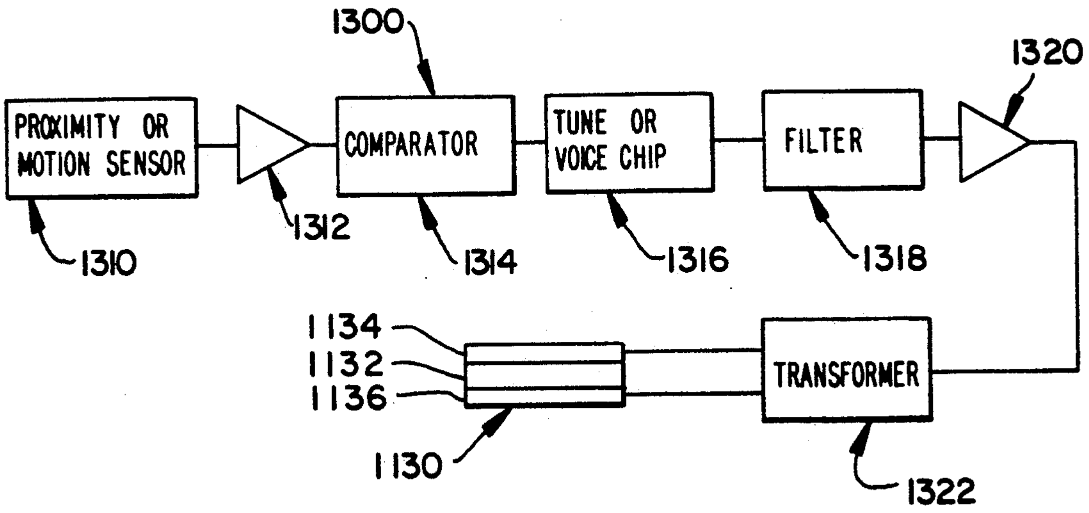
FIG. 13 is a schematic of the device shown in FIGS. 11 and 12 for supplying an audio-frequency signal voltage across the piezoelectric film when a viewer passes in front of the poster.

Turning now to FIG. 13, the circuit for generating the audio-frequency signal voltage is generally designated 1300. The circuit contains a conventional proximity or motion sensor 1310 which is used as the switching mechanism to activate the tune or voice chip 1316. Passive infrared detectors, such as model numbers 400 or 404 available from Eltec Instruments, Inc., Daytona Beach, Fla. are examples of suitable motion sensors. Ultrasonic-, capacitive- or light beam-type proximity or motion sensors can also be used in the present invention. For discussion purposes, a passive infrared detector will be used as the sensor 1310. The output from the sensor 1310 is supplied to an amplifier 1312. The amplified output is then compared to a set point valve in a comparator 1314. If the amplified output exceeds the set point, a conventional programmable tune or voice chip 1316 is activated to generate the audio-frequency signal. If the chip 1316 is a voice chip, then the audio-frequency signal is passed through a filter 1318 before entering the amplifier 1320. When a tune chip 1316 is used, the filter 1318 may be eliminated. The amplified audio-frequency signal leaving the amplifier 1320 then passes through a conventional transformer 1322 where the volume of the sound to be produced by the electroacoustic transducer 1130 can be controlled. Although the circuit illustrates the use of a tune or voice chip, other conventional audio-frequency generators, such as tape recorders, radios, etc., may be activated by the proximity sensor 1310.

Figure 14:
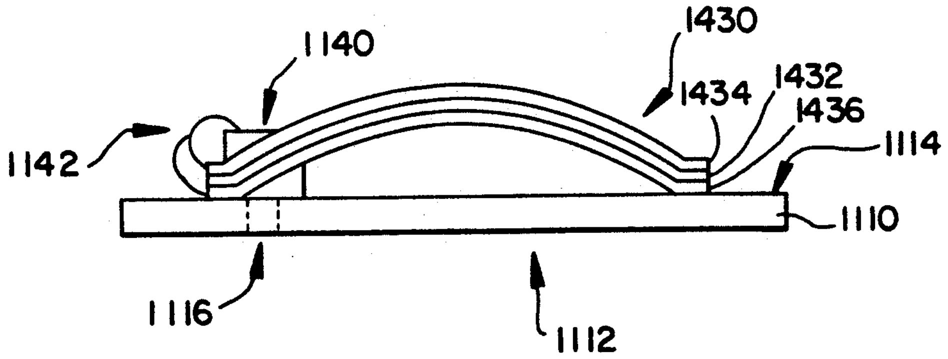
FIG. 14 is a section view of an alternative embodiment of the electroacoustic poster shown in FIGS. 11 and 12.

An alternative technique for mounting the piezoelectric transducer 1430 is shown in FIG. 14. This technique eliminates the mounting member 1120 shown in FIGS. 11 and 12. The transducer 1430 contains a piezoelectric polymer film layer 1432 with first and second electrodes 1434 and 1436, respectively, disposed over its opposed major surfaces. The transducer 1430 is mounted directly on the poster 1110 so that it bows outwardly allowing for free vibration when an audio-frequency signal is applied. The transducer 1430 is mounted on the back surface 1114 of the poster 1110 in the same manner as the mounting member 1120 in FIGS. 11 and 12. The piezoelectric film with electrodes may also be formed into a dome or other shape having a curved cross section using conventional mechanical and vacuum thermoforming techniques. A lip is provided around the edge of the dome to allow for attachment to the poster 1110 with an adhesive.

Although the mounting techniques shown in FIGS. 11, 12 and 14 have been illustrated with a poster, these techniques may also be used to mount a piezoelectric transducer on other display items, such as a banner, or the headwear novelties.

We claim:

1. An electroacoustic novelty, comprising:

a flexible substrate forming at least a portion of said novelty, at least a portion of said substrate having a curved, non-enclosed cross section;

a transparent piezoelectric polymer film having opposed first and second surfaces;

a first transparent electrode electrically coupled with said first surface;

a second transparent electrode electrically coupled with said second surface;

means for conformably adhering said film to the portion of said substrate having the curved, noncontinuous cross section; and means electrically coupled with said first and second electrodes for applying an audio-frequency signal voltage across said film to cause said film and associated portion of said substrate having the curved, noncontinuous cross section to vibrate and emit sound waves.

2. An electroacoustic novelty according to claim 1 wherein said substrate is a banner having an outwardly facing display surface.

3. An electroacoustic novelty according to claim 1 wherein said substrate is a poster having an outwardly facing display surface.

4. An electroacoustic novelty with microphone, comprising:

a flexible substrate forming at least a portion of said novelty, at least a portion of said substrate having a curved, noncontinuous cross section;

a piezoelectric polymer film having opposed first and second surfaces which responds to received sound waves by vibrating with said substrate and producing an electrical audio signal;

a first electrode electrically coupled with said first surface;

a second electrode electrically coupled with said second surface;

a device responsive to processed electrical audio signals;

means for conformably adhering said film to the portion of said substrate having the curved, noncontinuous cross section; and receiving means electrically coupled with said first and second electrodes for processing the electrical audio signal generated by said film when said film is caused to vibrate by sound waves and delivering the processed electrical audio signal to said device.

5. An electroacoustic novelty according to claim 4 wherein said substrate is a banner having an outwardly facing display surface.

6. An electroacoustic novelty according to claim 4 wherein said substrate is a poster having an outwardly facing display surface.

7. An electroacoustic novelty, having a loudspeaker comprising:

a transparent piezoelectric polymer film having a curved, noncontinuous cross section forming at least a portion of said novelty, said film having first and second opposed surfaces;

a first transparent electrode electrically coupled with said first surface;

a second transparent electrode electrically coupled with said second surface; and means electrically coupled with said first and second electrodes for applying an audio-frequency signal voltage across said film to cause said film to vibrate and emit sound waves.

8. An electroacoustic novelty according to claim 7 wherein said film is a banner having an outwardly facing display surface.

9. An electroacoustic novelty according to claim 7 wherein said film is a poster having an outwardly facing display surface.

10. An electroacoustic novelty according to claim 7, further comprising:

a dielectric polymer film disposed over at least one of said first and second electrodes.

11. An electroacoustic novelty with audio-frequency transducer, comprising:

a piezoelectric polymer film having a curved, noncontinuous cross section forming at least a portion of said novelty, said film having first and second opposed surfaces and responding to processed electrical signals by vibrating and producing sound waves;

a first electrode electrically coupled with said first surface;

a second electrode electrically coupled with said second surface; and receiving means electrically coupled with said first and second electrodes for processing electrical signals which are then delivered to said film whereby said film is caused to vibrate and produce sound waves.

12. An electroacoustic novelty according to claim 11 wherein said film is a banner having an outwardly facing display surface.

13. An electroacoustic novelty according to claim 11 wherein said film is a poster having an outwardly facing display surface.

14. An electroacoustic novelty according to claim 11, further comprising:

a dielectric polymer film disposed over at least one of said first and second electrodes.

15. An electroacoustic display device, comprising:

a substrate having a display surface;

a flexible mounting member attached to said substrate so that a portion of said member is freely spaced away from said substrate;

a piezoelectric polymer film attached to the freely spaced portion of said member, said film having opposed first and second surfaces with a first electrode electrically coupled with said first surface and a second electrode electrically coupled with said second surface;

means electrically coupled with said first and second electrodes for applying an audio-frequency signal voltage across said film to cause said film and said flexible mounting member to vibrate and emit sound waves; and a sensor for activating said means for applying an audio-frequency signal voltage.

16. An electroacoustic display device according to claim 15 wherein said sensor is a proximity sensor.

17. An electroacoustic display device according to claim 16 wherein said substrate is a poster with said flexible mounting member, said means for applying an audio-frequency signal voltage and said proximity sensor are mounted on a side opposite to said display surface, and said poster further containing an aperture through which the proximity sensor views the area in front of said display surface.

18. An electroacoustic display device according to claim 15 wherein said sensor is a motion sensor.

19. An electroacoustic display device according to claim 18 wherein said substrate is a poster with said flexible mounting member, said means for applying an audio-frequency signal voltage and said motion sensor are mounted on a side opposite to said display surface, and said poster further containing an aperture through which the motion sensor views the area in front of said display surface.

20. An electroacoustic display device, comprising:

a substrate having a display surface;

a piezoelectric polymer film attached to said substrate so that a portion of said film is freely spaced away from said substrate, said film having opposed first and second surfaces with a first electrode electrically coupled with said first surface and a second electrode electrically coupled with said second surface;

means electrically coupled with said first and second electrodes for applying an audio-frequency signal voltage across said film to cause said film to vibrate and emit sound waves; and a sensor for activating said means for applying an audio-frequency signal voltage.

21. An electroacoustic display device according to claim 20 wherein said sensor is a proximity sensor.

22. An electroacoustic display device according to claim 21 wherein said substrate is a poster with said piezoelectric polymer film, said means for applying an audio-frequency signal voltage and said proximity sensor are mounted on a side opposite to said display surface, and said poster further containing an aperture through which the proximity sensor views the area in front of said display surface.

23. An electroacoustic display device according to claim 20 wherein said sensor is a motion sensor.

24. An electroacoustic display device according to claim 23 wherein said substrate is a poster with said piezoelectric polymer film, said means for applying an audio-frequency signal voltage and said motion sensor are mounted on a side opposite to said display surface, and said poster further containing an aperture through which the motion sensor views the area in front of said display surface.

25. An electroacoustic display device according to claim 15 wherein a portion of the mounting member bows outwardly away from the substrate.

26. An electroacoustic display device according to claim 20 wherein a portion of the piezoelectric polymer film bows outwardly away from the substrate.

* * * * *